(12) United States Patent
Sekiya

(10) Patent No.: US 10,569,442 B2
(45) Date of Patent: Feb. 25, 2020

(54) CUTTING BLADE MOUNTING MECHANISM

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/134,560

(22) Filed: Sep. 18, 2018

(65) Prior Publication Data

US 2019/0084175 A1 Mar. 21, 2019

(30) Foreign Application Priority Data

Sep. 21, 2017 (JP) .................................. 2017-181005

(51) Int. Cl.
 *B26D 7/26* (2006.01)
 *H01L 21/67* (2006.01)

(52) U.S. Cl.
 CPC ...... *B26D 7/2621* (2013.01); *H01L 21/67092* (2013.01)

(58) Field of Classification Search
 CPC .................. B26D 7/2621; H01L 21/67092
 USPC .......................................................... 83/665
 See application file for complete search history.

(56) References Cited

U.S. PATENT DOCUMENTS

| 2015/0020666 A1* | 1/2015 | Wakita | ................. | B26D 7/2621 |
| | | | | 83/401 |
| 2016/0207216 A1* | 7/2016 | Nitta | ..................... | B26D 7/2621 |
| 2016/0339596 A1* | 11/2016 | Matsuyama | ........... | B26D 7/018 |

FOREIGN PATENT DOCUMENTS

| JP | 554821 A | 7/1993 |
| JP | 2002154054 A | 5/2002 |

* cited by examiner

*Primary Examiner* — Kenneth E Peterson
*Assistant Examiner* — Liang Don
(74) *Attorney, Agent, or Firm* — Greer Burns & Crain Ltd.

(57) ABSTRACT

A cutting blade mounting mechanism includes: a blade mount mounted to a spindle; and an air supply unit supplying air to the blade mount. The blade mount includes: a columnar boss section inserted into a through-hole provided in an annular base of the cutting blade; a flange section projecting in a radial direction from a side of a base end of the boss section; and an ejector type blade suction section having a first air passage connecting a supply port supplied with air from the air supply unit and a discharge port discharging the air, and a second air passage connecting a suction port opening to a side of a support surface of the flange section and the first air passage. A plurality of the discharge ports are formed in an outer peripheral face of the boss section.

6 Claims, 8 Drawing Sheets

CUTTING BLADE MOUNTING MECHANISM

BACKGROUND OF THE INVENTION

Field of the Invention

The present invention relates to a cutting blade mounting mechanism for mounting a cutting blade to a spindle.

Description of the Related Art

A cutting apparatus having an annular cutting blade mounted to a spindle serving as a rotary shaft has been used for processing a plate-shaped workpiece represented by a semiconductor wafer or a packaged substrate (see, for example, Japanese Utility Model Laid-Open No. Hei 5-54821). The cutting blade is mounted to a tip portion of the spindle through mounting means such as blade mounts for clamping both sides of the cutting blade, and is replaced when worn to a certain degree.

Replacement of the cutting blade is generally carried out manually by an operator. For the replacing operation, various tools are used so as not to damage various mechanisms in the cutting apparatus as well as the mounting means, the cutting blade, and the like. Therefore, for the replacement of the cutting blade, a certain length of operating time has been required in addition to a skilled operator.

In contrast, a mounting mechanism in which a negative pressure is applied to a cutting blade from mounting means fixed to a spindle to suck and fix the cutting blade has been proposed (see, for example, Japanese Patent Laid-open No. 2002-154054). By use of this mounting mechanism, the cutting blade can be easily replaced in a shorter time, as compared to the case where the conventional mounting means for clamping both sides of the cutting blade is used.

SUMMARY OF THE INVENTION

Meanwhile, in the conventional cutting apparatuses, for example, an air supply source for supplying air to a spindle or the like has been used, but a negative pressure generation source (suction source) such as a vacuum pump has not been used. Accordingly, in the case of adopting the aforementioned mounting mechanism in which the cutting blade is sucked and fixed by a negative pressure, it is necessary to newly prepare a negative pressure generation source.

In addition, an inner diameter of a through-hole formed in a central portion of the cutting blade is formed to be slightly larger than an outer diameter of an insertion section (boss section) of mounting means inserted in the through-hole in order to prevent the mounting means from being abraded by excessive interference with the cutting blade. Therefore, simply mounting the cutting blade to the spindle may often result in misalignment between the center of rotation of the spindle and the center of rotation of the cutting blade.

For example, by a treatment called roundness dressing or the like, an outer periphery of the cutting blade may be partly abraded, whereby the center of rotation of the cutting blade and the center of rotation of the spindle can be aligned with each other. However, when the cutting blade is partly abraded by this treatment, the number of workpieces which can be cut by the cutting blade would be reduced.

Accordingly, it is an object of the present invention to provide a cutting blade mounting mechanism in which it is unnecessary to separately prepare a negative pressure generation source and it is easy to align a position of a cutting blade relative to a spindle.

In accordance with an aspect of the present invention, there is provided a cutting blade mounting mechanism for mounting a cutting blade to a tip portion of a spindle of a cutting apparatus, the cutting apparatus including a chuck table holding a workpiece, and a cutting unit cutting the workpiece held by the chuck table by the cutting blade mounted to the tip portion of the spindle rotatably supported by a spindle housing, the cutting blade having a cutting edge at an outer periphery of an annular base, the cutting blade mounting mechanism including: a blade mount mounted to the tip portion of the spindle; and an air supply unit supplying air to the blade mount. The blade mount includes: a columnar boss section inserted into a through-hole provided in the annular base of the cutting blade; a flange section projecting in a radial direction from a side of a base end of the boss section and having a support surface supporting the cutting blade; and an ejector type blade suction section having a first air passage connecting a supply port supplied with air from the air supply unit and a discharge port discharging the air, and a second air passage connecting a suction port opening to a side of the support surface of the flange section and the first air passage, and the ejector type blade suction section sucking the cutting blade by a negative pressure applied from the suction port. A plurality of the discharge ports are formed in an outer peripheral face of the boss section, and an interval between an inner peripheral face of the annular base of the cutting blade into which the boss section is inserted, and the outer peripheral face of the boss section is controlled by the air discharged from the discharge ports.

In another aspect of the present invention, an inner diameter of the second air passage in a connection region where the first air passage and the second air passage are connected is smaller than an inner diameter of the first air passage.

Also, in another aspect of the present invention, the air supply unit may be a rotary joint fixed to the spindle housing and supplying air to the blade mount rotated together with the spindle.

Moreover, in still another aspect of the present invention, an air bearing section rotatably supporting the spindle by air and discharging the air through a gap between the spindle housing and the spindle toward a side of the tip portion of the spindle may be provided inside the spindle housing, and the supply port of the blade mount may be supplied with the air discharged through the gap.

The cutting blade mounting mechanism according to one aspect of the present invention includes: the air supply unit supplying air; and the blade mount including the ejector type blade suction section generating a negative pressure by utilizing the air supplied from the air supply unit. Therefore, since the cutting blade can be sucked and fixed by the negative pressure generated from the blade suction section, it is unnecessary to separately prepare a negative pressure generation source.

In addition, in the cutting blade mounting mechanism according to one aspect of the present invention, the plurality of discharge ports are formed in the outer peripheral face of the boss section. Therefore, the interval between the inner peripheral face of the annular base of the cutting blade, into which the boss section is inserted, and the outer peripheral face of the boss section is controlled by the air discharged from the discharge ports. Accordingly, it is easy to align the cutting blade relative to the spindle.

The above and other objects, features and advantages of the present invention and the manner of realizing them will become more apparent, and the invention itself will best be understood from a study of the following description and appended claims with reference to the attached drawings illustrating preferred embodiments of the invention.

DETAILED DESCRIPTION OF THE PREFERRED EMBODIMENTS

Figure 1:
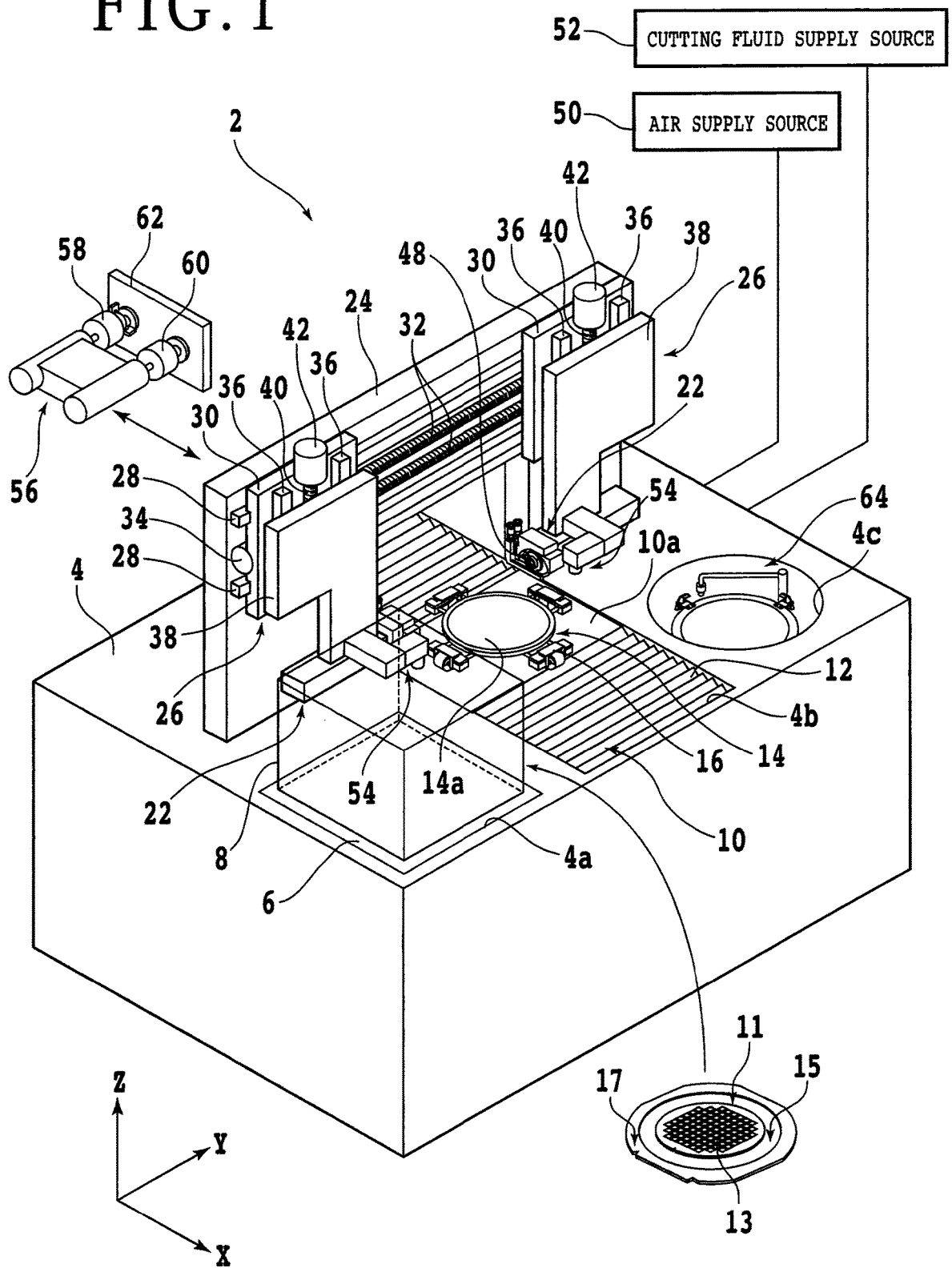
FIG. 1 is a perspective view schematically illustrating a configuration example of a cutting apparatus.

An embodiment according to an aspect of the present invention will be described with reference to the attached drawings. FIG. 1 is a perspective view schematically illustrating a configuration example of a cutting apparatus into which a cutting blade mounting mechanism (hereinafter referred to as a mounting mechanism) according to the present embodiment is incorporated. As illustrated in FIG. 1, a cutting apparatus 2 includes a base 4 supporting each of components.

The base 4 is formed with an opening 4a in a front corner portion, and a cassette support base 6 lifted upward and downward by a lift mechanism (not illustrated) is provided in the opening 4a. A cassette 8 for accommodating a plurality of workpieces 11 is mounted on an upper face of the cassette support base 6. Note that, in FIG. 1, only an outline of the cassette 8 is illustrated, for convenience of explanation.

The workpiece 11 is, for example, a circular disk-shaped wafer composed of a semiconductor material such as silicon. A front surface side of the workpiece 11 is partitioned into a plurality of regions by a plurality of intersecting division lines (streets), and a device 13 such as an IC (Integrated Circuit) is formed in each of the regions.

An adhesive tape (dicing tape) 15 having a diameter larger than a diameter of the workpiece 11 is adhered to a back surface side of the workpiece 11. A peripheral portion of the adhesive tape 15 is fixed to an annular frame 17. The workpiece 11 is accommodated in the cassette 8 in a state of being supported on the frame 17 through the adhesive tape 15.

Note that, while the workpiece 11 is the circular disk-shaped wafer composed of a semiconductor material such as silicon in the present embodiment, there is no limitation to a material, a shape, a structure, a size, and the like of the workpiece 11. For example, a substrate composed of such a material as other semiconductor, a ceramic, a resin, a metal, or the like may be cut as a workpiece. Also, there is no limitation to a kind, a numerical quantity, a shape, a structure, a size, a layout, and the like of the device 13. The workpiece may not be formed with any device.

As illustrated in FIG. 1, on a side of the cassette support base 6, an opening 4b which is elongate in an X-axis direction (a front-rear direction or a processing feeding direction) is formed. A ball screw type X-axis moving mechanism 10 and a dustproof and droplet-proof cover 12 covering an upper portion of the X-axis moving mechanism 10 are disposed in the opening 4b. The X-axis moving mechanism 10 includes an X-axis moving table 10a, and moves the X-axis moving table 10a in the X-axis direction.

A chuck table 14 for sucking and holding the workpiece 11 is disposed on an upper side of the X-axis moving table 10a. The chuck table 14 is connected to a rotational drive source (not illustrated) such as a motor, and is rotated about a rotational axis substantially parallel to a Z-axis direction (vertical direction). Also, the chuck table 14 is moved in the X-axis direction (feeding for processing) by the above-mentioned X-axis moving mechanism 10.

An upper face of the chuck table 14 is a holding surface 14a for sucking and holding the workpiece 11. The holding surface 14a is formed to be substantially parallel to the X-axis direction and a Y-axis direction (a left-right direction or an indexing feeding direction), and is connected to an ejector (not illustrated) through a suction passage (not illustrated) and the like provided inside the chuck table 14. In addition, four clamps 16 for fixing the annular frame 17 supporting the workpiece 11, from four directions, are provided in a periphery of the chuck table 14.

A carrying unit (not illustrated) for carrying the above-mentioned workpiece 11 to the chuck table 14 and the like is disposed in a region adjacent to the opening 4b. The workpiece 11 carried by the carrying unit is mounted on the holding surface 14a of the chuck table 14, for example, in such a way that the front surface side is exposed upward.

A gate-type support structure 24 for supporting two sets of cutting units 22 is disposed on an upper face of the base 4 in such a manner as to straddle the opening 4b. Two sets of cutting unit moving mechanisms 26 moving each of the cutting units 22 in the Y-axis direction and the Z-axis direction are provided at an upper portion of a front face of the support structure 24.

The cutting unit moving mechanisms 26 shares a pair of Y-axis guide rails 28 disposed on the front face of the support structure 24 and parallel to the Y-axis direction. A Y-axis moving plate 30 constituting each of the cutting unit moving mechanisms 26 is slidably attached to the Y-axis guide rails 28. A nut section (not illustrated) is provided on a back surface side (rear face side) of each of the Y-axis moving plates 30, and Y-axis ball screws 32 parallel to the Y-axis guide rails 28 are screwed into the nut sections. A Y-axis pulse motor 34 is connected to one end portion of each of the Y-axis ball screws 32. When the Y-axis ball screw 32 is rotated by the Y-axis pulse motor 34, the Y-axis moving plate 30 is moved in the Y-axis direction along the Y-axis guide rails 28.

A pair of Z-axis guide rails 36 parallel to the Z-axis direction is provided on a front surface (front face) of each of the Y-axis moving plates 30. A Z-axis moving plate 38 is slidably mounted to the pair of Z-axis guide rails 36. A nut section (not illustrated) is provided on a back surface side (rear face side) of each of the Z-axis moving plates 38, and a Z-axis ball screw 40 parallel to the Z-axis guide rails 36 is screwed into the nut section. A Z-axis pulse motor 42 is connected to one end portion of each of the Z-axis ball screws 40. When the Z-axis ball screw 40 is rotated by the Z-axis pulse motor 42, the Z-axis moving plate 38 is moved in the Z-axis direction along the pair of Z-axis guide rails 36.

The cutting unit 22 is provided at a lower portion each of the Z-axis moving plates 38. The cutting unit 22 includes a spindle 44 (see FIG. 2 etc.) having an axis substantially parallel to the Y-axis direction. The spindle 44 is accommodated in an inner space of a spindle housing 46 (see FIG. 2 etc.) configured in a cylindrical shape. One end portion (tip portion) 44b (see FIG. 2 etc.) of the spindle 44 is exposed outside the spindle housing 46, and a circular annular cutting blade 48 is mounted to the one end portion 44b.

An air supply source 50 for supplying air, and a cutting fluid supply source 52 for supplying a cutting fluid represented by water are connected to the cutting unit 22. Note that the air supply source 50 is connected also to the ejector (not illustrated) for generating a negative pressure at the chuck table 14. The details of the cutting unit 22 will be described later.

An imaging unit (camera) 54 for imaging the workpiece 11 and the like is provided at a position adjacent to each of the cutting units 22. When the Y-axis moving plate 30 is moved in the Y-axis direction by each of the cutting unit moving mechanisms 26, the cutting unit 22 and the imaging unit 54 are moved in the Y-axis direction (indexing feeding). In addition, when the Z-axis moving plate 38 is moved in the Z-axis direction by each of the cutting unit moving mechanisms 26, the cutting unit 22 and the imaging unit 54 are moved in the Z-axis direction.

An auto-blade changer 56 capable of automatically replacing the cutting blade 48 is disposed on a rear side of the support structure 24. The auto-blade changer 56 includes a first blade mounting/detaching unit 58 and a second blade mounting/detaching unit 60 for mounting the cutting blade 48 to the cutting unit 22 or detaching the cutting blade 48 from the cutting unit 22.

In addition, the auto-blade changer 56 is supported by an auto-blade changer moving mechanism (not illustrated), and is moved between a retracted position on a rear side and a mounting/detaching position on a front side. A blade rack 62 on which the cutting blade 48 mounted to or detached from the cutting unit 22 by the auto blade changer 56 is hooked is disposed in a vicinity of the retracted position.

An opening 4c is formed at a position opposite to the opening 4a with respect to the opening 4b. A cleaning unit 64 for cleaning the workpiece 11 etc. after being cut is disposed in the opening 4c. In addition, a control unit (not illustrated) is connected to components such as the X-axis moving mechanism 10, the chuck table 14, the cutting units 22, the cutting unit moving mechanisms 26, the imaging units 54, the auto-blade changer 56, the auto-blade changer moving mechanism, and the cleaning unit 64. Each of the components is controlled by the control unit.

Figure 2:
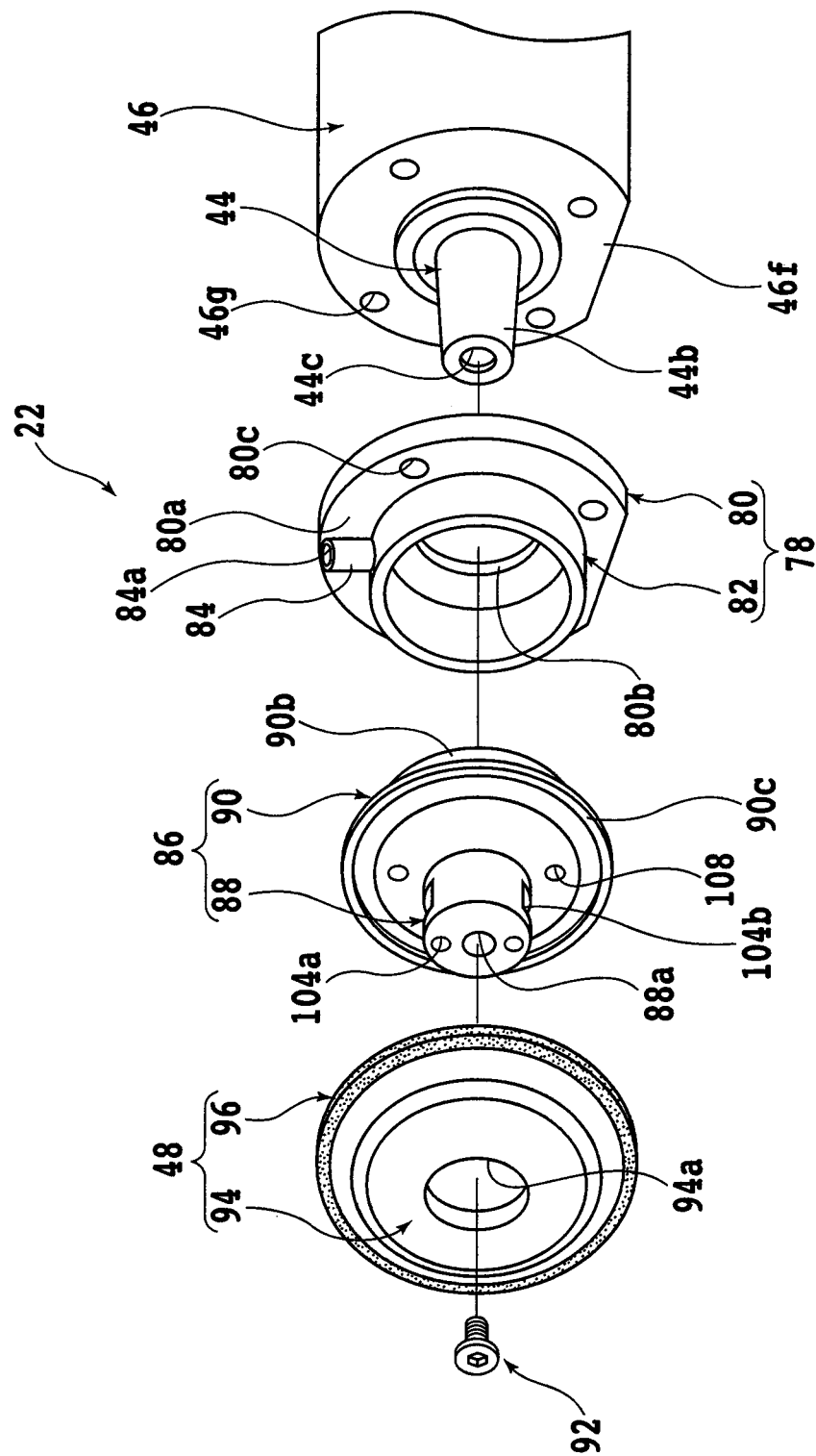
FIG. 2 is an exploded perspective view schematically illustrating a configuration example of a cutting unit.
Figure 3:
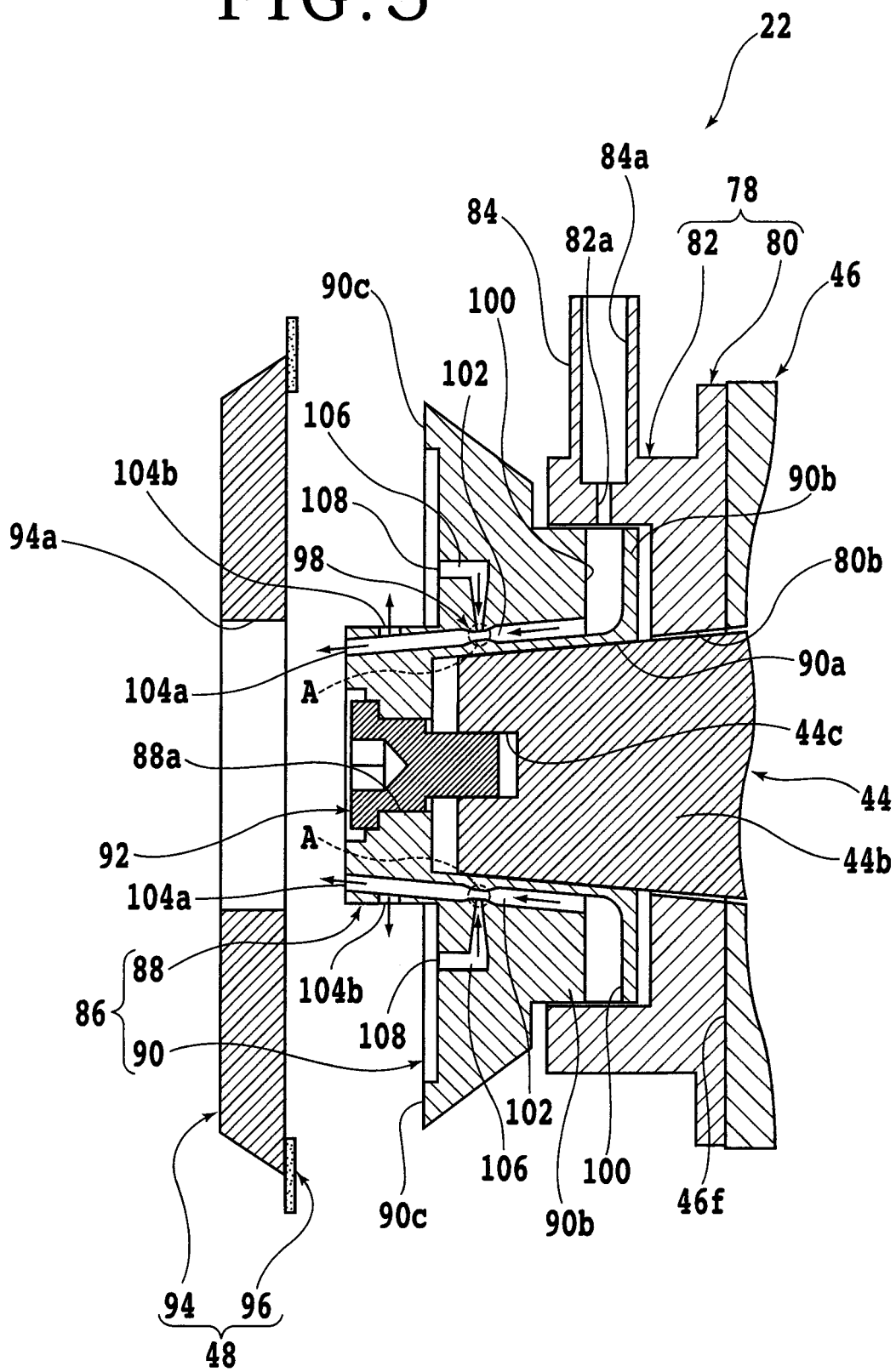
FIG. 3 is a sectional view schematically illustrating a state before a cutting blade is mounted to the cutting unit.
Figure 4:
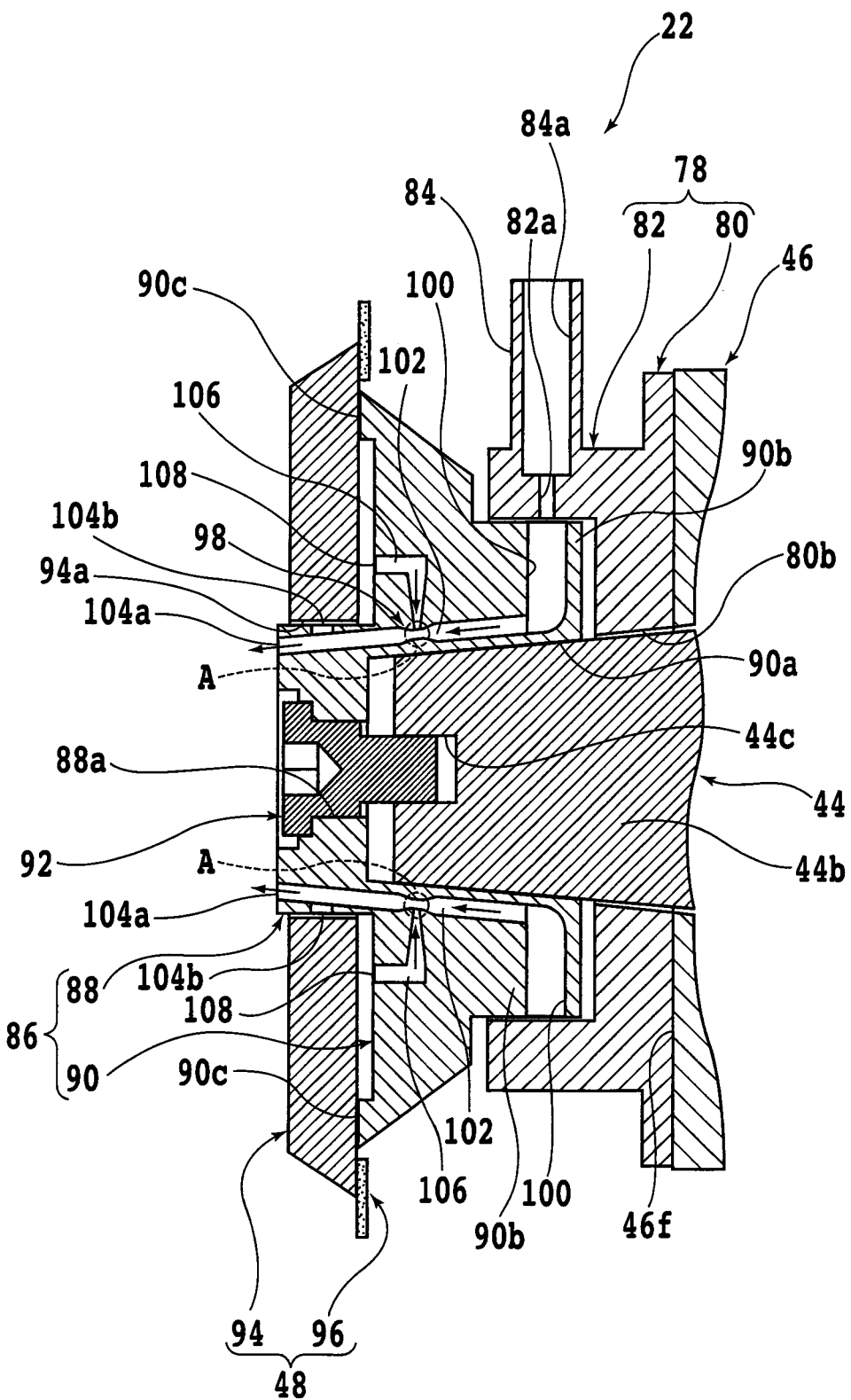
FIG. 4 is a sectional view schematically illustrating a state after the cutting blade is mounted to the cutting unit.

FIG. 2 is an exploded perspective view schematically illustrating a configuration example of the cutting unit 22. FIG. 3 is a sectional view schematically illustrating a state before the cutting blade 48 is mounted to the cutting unit 22, and FIG. 4 is a sectional view schematically illustrating a state after the cutting blade 48 is mounted to the cutting unit 22.

Figure 5:
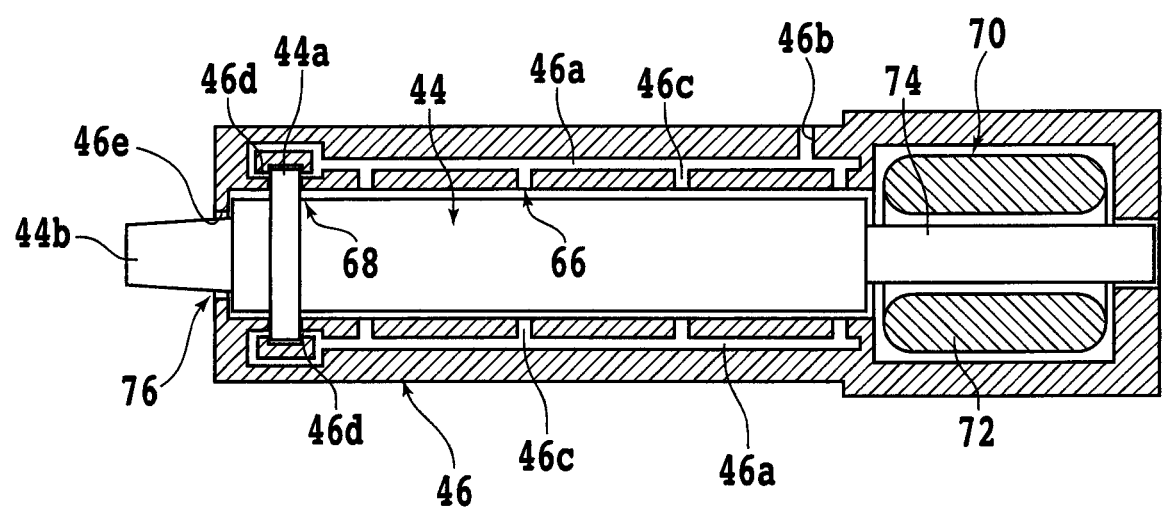
FIG. 5 is a sectional view schematically illustrating a configuration example of a spindle and a spindle housing included in the cutting unit.

In addition, FIG. 5 is a sectional view schematically illustrating a configuration example of the spindle 44 and the spindle housing 46 included in the cutting unit 22. As illustrated in FIG. 5, inside the spindle housing 46 (inside a wall material thereof), air supply passages 46a substantially parallel to an axis of the spindle 44 are formed.

The air supply passages 46a are connected to the outside air supply source 50 through an air supply port 46b. Also, the air supply passages 46a are connected to a radial air bearing section (air bearing section) 66 through first supply passages 46c, and are connected to a thrust air bearing section (air bearing section) 68 through second air supply passages 46d.

By supplying high-pressure air from the air supply source 50 to the radial air bearing section 66 and the thrust air bearing section 68, the spindle 44 is kept in a floated state in the inner space of the spindle housing 46. For example, the radial air bearing section 66 blows air to the spindle 44 in a direction perpendicular to the axis, thereby keeping the position of the spindle 44 constant in the direction perpendicular to the axis.

In contrast, the thrust air bearing section 68 blows air to a circular disk-shaped thrust plate 44a provided on the spindle 44 in a direction parallel to the axis of the spindle 44, thereby keeping the position of the spindle 44 constant in the direction parallel to the axis. The radial air bearing section 66 and the thrust air bearing section 68 stably support the spindle 44 rotated at a high speed.

The spindle housing 46 is provided with an opening 46e on one end (tip) side thereof. The spindle 44 is inserted in the opening 46e in such a manner that the one end portion (tip portion) 44b formed in a truncated conical shape is exposed outside the spindle housing 46. In other words, the one end portion 44b of the spindle 44 protrudes outside the opening 46e of the spindle housing 46.

A motor 70 applying a force for rotating the spindle 44 is connected to the other end side of the spindle 44. The motor 70 includes a stator 72 fixed inside the spindle housing 46, and a rotor 74 integral with the spindle 44, and rotates the spindle 44 by a magnetic force applied between the stator 72 and the rotor 74. Note that, while the spindle 44 and the rotor 74 are formed integral with each other in the present embodiment, a spindle and a rotor formed separately may be connected together to be used.

Part of the air supplied to the radial air bearing section 66 and the thrust air bearing section 68 is discharged (jetted out) outside the spindle housing 46 through an air seal section (air seal) 76 corresponding to a gap between the one end portion 44b of the spindle 44 and the opening 46e of the spindle housing 46.

This air flow seals (air-seals) the gap between the one end portion 44b of the spindle 44 and the opening 46e of the spindle housing 46. In other words, foreign matter such as cutting dust (cutting chips) would not enter the inner space of the spindle 44 through the gap between the one end portion 44b of the spindle 44 and the opening 46e of the spindle housing 46.

As illustrated in FIGS. 2 and 3, a rotary joint (air supply unit) 78 constituting the mounting mechanism according to the present embodiment is attached to one end face (tip face) 46f of the spindle housing 46. The rotary joint 78 includes a plate-shaped base section 80, and a cylindrical accommodation section 82 projecting to a front surface 80a side (a side opposite to the spindle housing 46) of the base section 80.

The base section 80 is provided in a central portion thereof with a through-hole 80b through which to pass the one end portion 44b of the spindle 44. In addition, one end face 46f of the spindle housing 46 is provided with a plurality of tapped holes 46g, and the base section 80 is provided with a plurality of through-holes 80c corresponding to the tapped holes 46g. Therefore, by tightening screws (not illustrated) to the tapped holes 46g through the through-holes 80c, the rotary joint 78 can be fixed to the spindle housing 46.

A tubular connection section 84 having an air passage 84a therein is disposed on a peripheral side of the accommodation section 82. The air supply source 50 is connected to one end of the connection section 84 (air passage 84a). In addition, the other end side of the connection section 84 (air passage 84a) is connected to an inner space of the accommodation section 82 through a through-hole 82a provided in the accommodation section 82. This enables air of the air supply source 50 to be supplied into the inner space of the accommodation section 82.

In a state in which the rotary joint 78 is fixed to the spindle housing 46, a blade mount 86 constituting the mounting mechanism according to the present embodiment is mounted to the one end portion 44b of the spindle 44. The blade mount 86 includes a cylindrical boss section (insertion section) 88, and a circular disk-shaped flange section 90 projecting radially outward from a base end side of the boss section 88.

A recess 90a into which the one end portion 44b of the spindle 44 is inserted is provided in a central portion on a back surface side (the spindle housing 46 side) of the flange section 90. In addition, the boss section 88 is provided in a central portion thereof with a through-hole 88a reaching the recess 90a. Further, an end face (tip face) of the one end portion 44b of the spindle 44 is formed with a tapped hole 44c.

Therefore, the one end portion 44b of the spindle 44 is inserted into the recess 90a, and a screw 92 is tightened to the tapped hole 44c of the spindle 44 through the through-hole 88a of the blade mount 86, so that the blade mount 86 can be fixed to the spindle 44. As a result, the blade mount 86 can be rotated together with the spindle 44.

Note that a diameter of the inner space of the accommodation section 82 is slightly larger than a diameter of a back-side portion 90b of the flange section 90, and when the blade mount 86 is fixed to the spindle 44, the back-side portion 90b of the flange section 90 is accommodated in the inner space of the accommodation section 82. A peripheral side of a front surface (a surface opposite to the spindle housing 46) of the flange section 90 is a support surface 90c supporting the cutting blade 48. This support surface 90c is formed in a circular annular shape as viewed from the axial direction of the spindle 44.

The cutting blade 48 is a so-called hub blade in which a circular annular cutting edge 96 for cutting the workpiece 11 is provided at an outer peripheral portion of a circular annular base 94. The cutting edge 96 is formed, for example, by dispersing abrasive grains of diamond, CBN (Cubic Boron Nitride), or the like in a bonding material (binder) such as a metal or a resin.

In a central portion of the base 94, a through-hole 94a into which the boss section 88 is inserted (passed). A diameter (inner diameter) of the through-hole 94a is larger than a diameter (a diameter of an outer peripheral face) of the boss section 88. Therefore, the base 94 of the cutting blade 48 would not interfere with the boss section 88 excessively.

Although a specific size of the through-hole 94a is not particularly limited, for example, it is considered that the diameter of the through-hole 94a is set to be larger than the diameter of the boss section 88 by 9 μm to 14 μm. At the time of mounting the cutting blade 48 to the blade mount 86, the boss section 88 is inserted into the through-hole 94a, and the back surface side of the base 94 is brought into contact with the support surface 90c of the flange section 90, as illustrated in FIG. 4.

As illustrated in FIGS. 3 and 4, inside the blade mount 86 (inside a wall material thereof), an ejector type blade suction section 98 is provided. The blade suction section 98 includes a supply port 100 opening in a peripheral face of the back-side portion 90b of the flange section 90. This supply port 100 is formed in an annular shape along a circumferential direction of the peripheral face of the back-side portion 90b.

In addition, the supply port 100 is formed at a position corresponding to the through-hole 82a provided in the accommodation section 82, in a state in which the back-side portion 90b of the flange section 90 is accommodated in the inner space of the accommodation section 82. Therefore, air from the air supply source 50 is supplied through the through-hole 82a to the supply port 100. Note that, since the supply port 100 is formed in an annular shape as described above, the supply of air to the supply port 100 is not stagnated even when the blade mount 86 is rotated together with the spindle 44.

The supply port 100 is connected to two first discharge ports 104a opening to a front surface side of the boss section 88 and two second discharge ports 104b opening in the outer peripheral face of the boss section 88, through two first air passages 102 formed inside the blade mount 86. The air supplied through the through-hole 82a of the rotary joint 78 to the supply port 100 is discharged outside the blade mount 86 through the first air passages 102 from each of the first discharge ports 104a and the second discharge ports 104b.

Therefore, in a state in which the boss section 88 is inserted in the through-hole 94a of the cutting blade 48, air discharged from each of the second discharge ports 104b is blown to an inner peripheral face of the base 94 (or an inner wall face of the through-hole 94a). Here, the two second discharge ports 104b are disposed at substantially equal angular intervals (or intervals of approximately 180°). Therefore, a distance between each of the second discharge ports 104b and the inner peripheral face of the base 94 is controlled so as to be substantially equal, by wind pressure of the air discharged from each of the second discharge ports 104b.

Specifically, by the air discharged from the second discharge ports 104b, a distance between the inner peripheral face of the base 94 of the cutting blade 48 and the outer peripheral face of the boss section 88 is controlled so as to be substantially constant at any places. As a result, the center of rotation of the cutting blade 48 is aligned to the center of rotation of the blade mount 86 (or the center of rotation of the spindle 44), so that the treatment called roundness dressing or the like can be omitted or simplified.

Note that part of the air discharged from each of the second discharge ports 104b is discharged (jetted out) to the front surface side of the cutting blade 48 and the blade mount 86 through the gap between the inner peripheral face of the base 94 of the cutting blade 48 and the outer peripheral face of the boss section 88. This air flow seals (air-seals) the gap between the inner peripheral face of the base 94 of the cutting blade 48 and the outer peripheral face of the boss section 88. In other words, foreign matter such as cutting dust would not enter the gap between the inner peripheral face of the base 94 of the cutting blade 48 and the outer peripheral face of the boss section 88.

A suction port 108 opening to a support surface 90c side of the flange section 90 is connected to a midstream portion of each of the first air passages 102 through each of second air passages 106. In connection regions A between the first air passages 102 and the second air passages 106, an inner diameter of the first air passage 102 is smaller than in other regions. Therefore, a flow speed of air flowing through the first air passage 102 is enhanced in the connection region A, and the connection region A is reduced in pressure by the Venturi effect.

This causes air in the second air passage 106 to flow into the first air passage 102, and a negative pressure from the suction port 108 is applied to a back surface side of the cutting blade 48. The cutting blade 48 is sucked and fixed to the blade mount 86 by this negative pressure. Note that an inner diameter of the second air passage 106 in the connection region A is desirably smaller than the inner diameter of the first air passage 102. This makes it difficult for the air flowing through the first air passage 102 to flow into the second air passage 106.

Note that, when the boss section 88 is inserted into the through-hole 94a of the cutting blade 48, the second discharge ports 104b are nearly closed with the inner peripheral face of the base 94 (the inner wall surface of the through-hole 94a), so that an amount of air discharged from the second discharge ports 104b is reduced. In other words, most of the air supplied from the supply port 100 is discharged from the first discharge ports 104a.

Therefore, the negative pressure applied to the cutting blade 48 would not be weakened to such an extent that the cutting blade 48 may not be sucked and fixed, due to the air discharged from the second discharge ports 104b and flowing into the suction port 108. Note that, since a small amount of air continues being discharged from the second discharge ports 104b, the effect of sealing (air seal) is maintained.

As has been described above, the cutting blade mounting mechanism according to the present embodiment includes the rotary joint (air supply unit) 78 for supplying air, and the blade mount 86 including the ejector type blade suction section 98 generating a negative pressure by utilizing the air supplied from the rotary joint 78. Therefore, since the cutting blade 48 can be sucked and fixed by the negative pressure generated from the blade suction section 98, it is unnecessary to separately prepare a negative pressure generation source.

In addition, in the cutting blade mounting mechanism according to the present embodiment, the two second discharge ports 104b are formed in the outer peripheral face of the boss section 88, and accordingly, an interval between the inner peripheral face of the annular base 94 of the cutting blade 48, into which the boss section 88 is inserted (passed), and the outer peripheral face of the boss section 88 is controlled by the air discharged from the second discharge ports 104b. Accordingly, the cutting blade 48 can be easily aligned relative to the spindle 44.

Note that the present invention is not limited to the description of the above embodiment and the like but may be carried out with various modifications. For example, although the two first air passages 102, the two first discharge ports 104a, the two second discharge ports 104b, the two second air passages 106, and the two suction ports 108 are provided in the above embodiment, the numerical quantity, the layout, and the like of each of components of the blade suction section 98 are not particularly limited.

For example, the numbers of the first air passages 102, the first discharge ports 104a, the second discharge ports 104b, the second air passages 106, and the suction ports 108 may be increased. In addition, the number of the first discharge ports 104a may be decreased, and the first discharge ports 104a may be omitted.

In addition, although the blade mount 86 (or the cutting blade 48) is so configured that the base 94 (back surface side) of the cutting blade 48 comes into contact with the support surface 90c of the flange section 90 in the above embodiment, the blade mount 86 (or the cutting blade 48) may be configured in such a manner that the cutting edge 96 of the cutting blade 48 comes into contact with the support surface 90c of the flange section 90.

Also, although the cutting apparatus 2 in the above embodiment includes the auto-blade changer 56 automatically capable of replacing the cutting blade 48, the auto-blade changer 56 may be omitted. Further, although a case where the adhesive tape 15 is adhered to a back surface side of the workpiece 11 and the front surface side of the workpiece 11 is exposed has been described in the above embodiment, the adhesive tape 15 may be adhered to the front surface side of the workpiece 11 and the back surface side of the workpiece 11 may be exposed.

Figure 6:
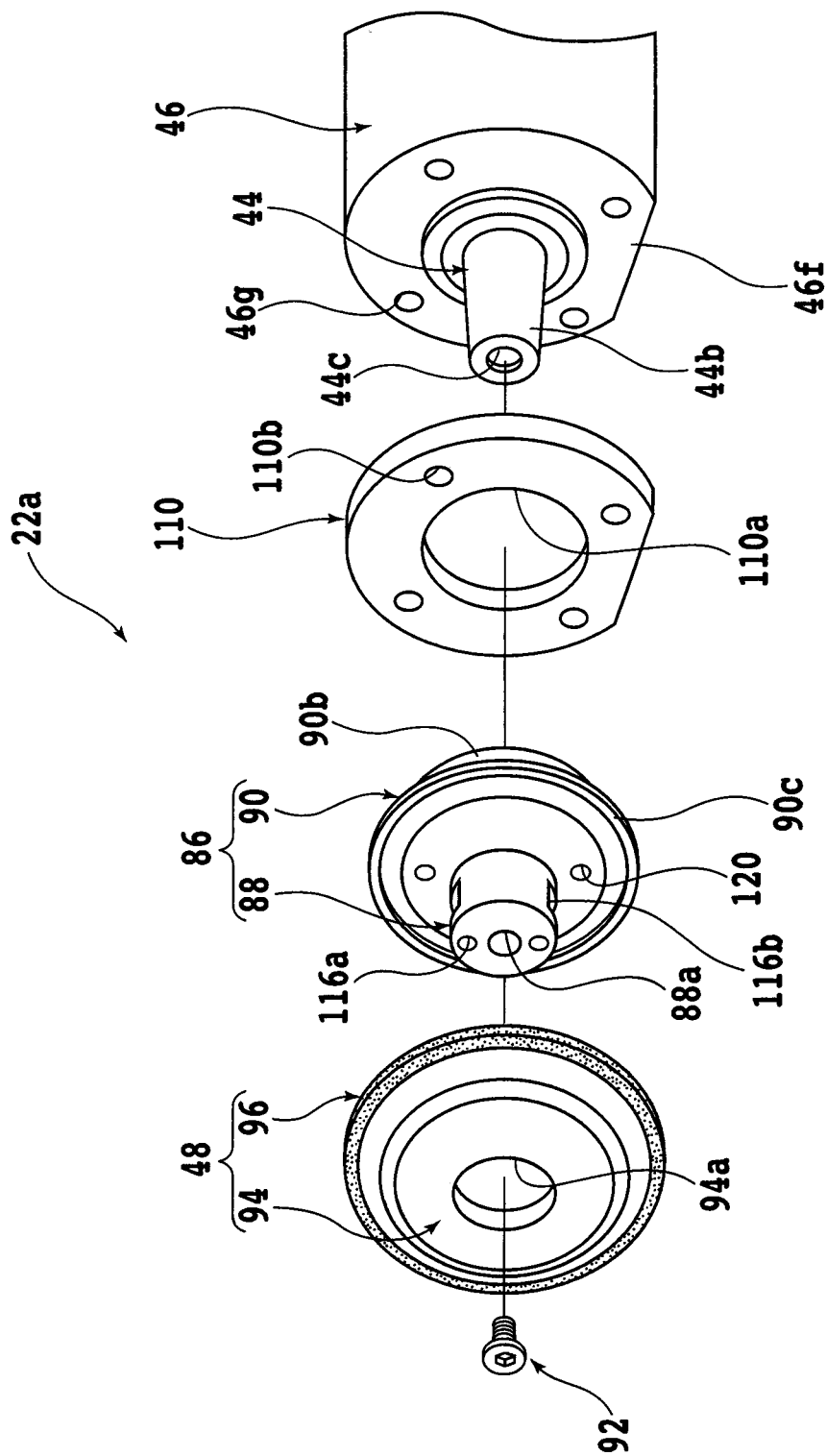
FIG. 6 is an exploded perspective view schematically illustrating a configuration example of a cutting unit according to a modification.
Figure 7:
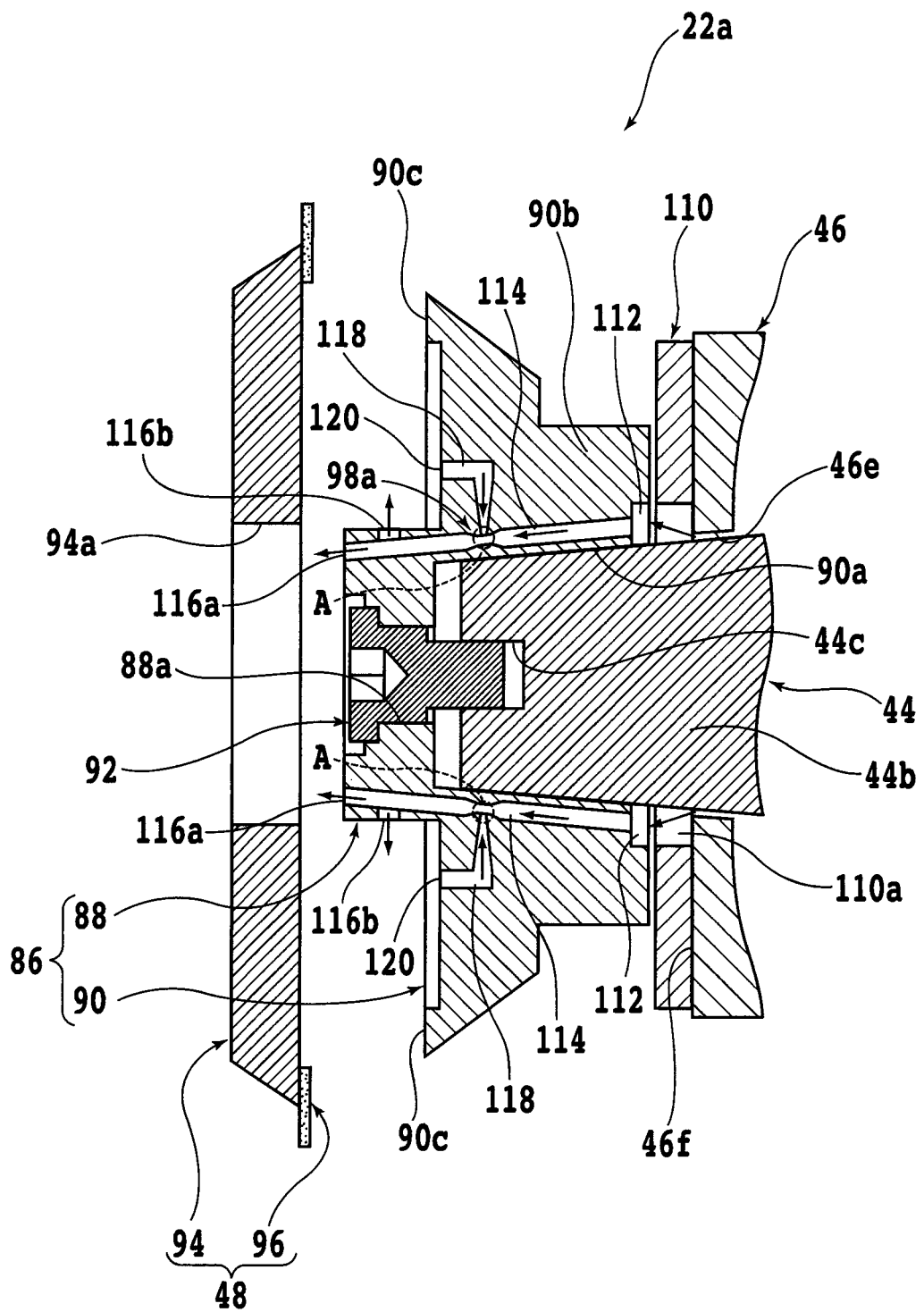
FIG. 7 is a sectional view schematically illustrating a state before a cutting blade is mounted to the cutting unit according to the modification.

In addition, although the cutting apparatus 2 in the above embodiment includes the rotary joint 78 for supplying air to the blade mount 86, other air supply unit may also be provided. FIG. 6 is an exploded perspective view schematically illustrating a configuration example of a cutting unit 22a according to a modification. FIG. 7 is a sectional view schematically illustrating a state before the cutting blade 48 is mounted to the cutting unit 22a according to the modification, and FIG. 8 is a sectional view schematically illustrating a state after the cutting blade 48 is mounted to the cutting unit 22a according to the modification.

Figure 8:
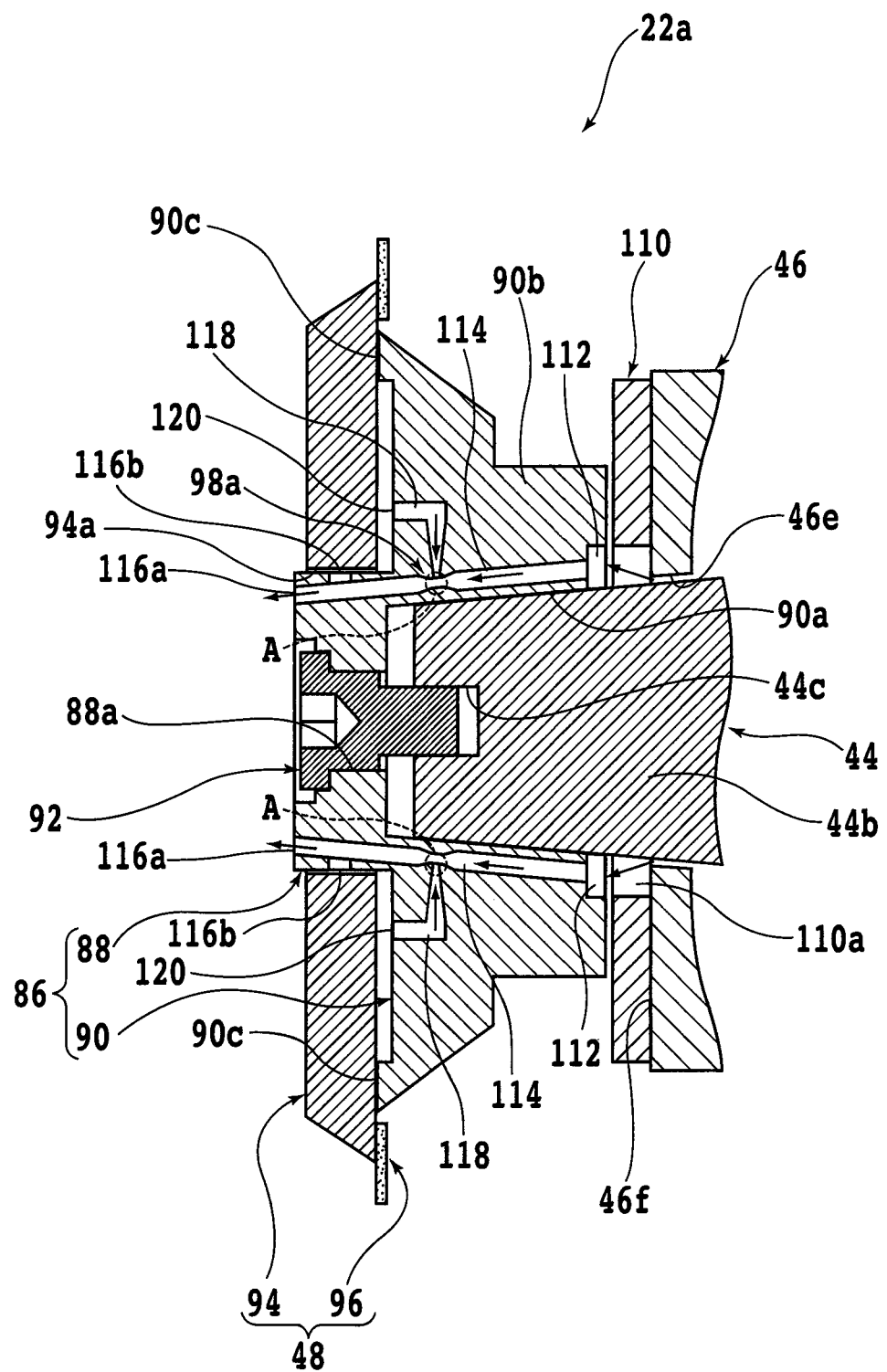
FIG. 8 is a sectional view schematically illustrating a state after the cutting blade is mounted to the cutting unit according to the modification.

As illustrated in FIGS. 6, 7 and 8, the cutting unit 22a according to the modification includes a plate-shaped adjusting plate (air supply unit) 110 for adjusting the flow of air discharged through the gap between the one end portion 44b of the spindle 44 and the opening 46e of the spindle housing 46. Note that most of the components of the cutting unit 22a according to the modification are the same as those of the cutting unit 22 according to the above embodiment. Therefore, the common components are denoted by the same reference symbols, and detailed description of them will be omitted.

In a central portion of the adjusting plate 110, a through-hole 110a through which the air discharged through the gap between the one end portion 44b of the spindle 44 and the opening 46e of the spindle housing 46, together with the one end portion 44b of the spindle 44, passes is provided. In addition, the adjusting plate 110 is provided with a plurality of through-holes 110b corresponding to the plurality of tapped holes 46g of the spindle housing 46. Therefore, screws (not illustrated) are tightened to the tapped holes 46g through the through-holes 110b, so that the adjusting plate 110 can be fixed to the spindle housing 46.

A blade suction section 98a according to the modification includes an annular supply port 112 opening to the back surface side of the flange section 90. This supply port 112 is formed, for example, at a position and in a size corresponding to the through-hole 110a of the adjusting plate 110. The air discharged through the gap between the one end portion 44b of the spindle 44 and the opening 46e of the spindle housing 46 is supplied to the supply port 112 through the through-hole 110a of the adjusting plate 110.

The supply port 112 is connected to two first discharge ports 116a opening to the front surface side of the boss section 88 and two second discharge ports 116b opening in the outer peripheral face of the boss section 88, through two first air passages 114 formed inside the blade mount 86. The air supplied to the supply port 112 through the through-hole 110a of the adjusting plate 110 is discharged outside the blade mount 86 through the first air passages 114 from the first discharge port 116a and the second discharge port 116b.

Therefore, in a state in which the boss section 88 is inserted in the through-hole 94a of the cutting blade 48, the air discharged from the second discharge ports 116b is blown to the inner peripheral face of the base 94 (or the inner wall face of the through-hole 94a). Here, the two discharge ports 116b are disposed at substantially equal angular intervals (or intervals of approximately 180°). Therefore, a distance between each of the second discharge ports 116b and the inner peripheral face of the base 94 is controlled so as to be substantially equal, by wind pressure of the air discharged from each of the second discharge ports 116b.

In other words, by the air discharged from the second discharge ports 116b, the interval between the inner peripheral face of the base 94 of the cutting blade 48 and the outer peripheral face of the boss section 88 is controlled so as to be substantially constant at any place. As a result, the center of rotation of the cutting blade 48 is aligned to the center of rotation of the blade mount 86 (or the center of rotation of the spindle 44), so that the treatment called roundness dressing can be omitted or simplified.

Note that part of the air discharged from the second discharge ports 116b is discharged (jetted out) to the front surface side of the cutting blade 48 and the blade mount 86 through the gap between the inner peripheral face of the base 94 of the cutting blade 48 and the outer peripheral face of the boss section 88. This air flow seals (air-seals) the gap between the inner peripheral face of the base 94 of the cutting blade 48 and the outer peripheral face of the boss section 88. In other words, foreign matter such as cutting dust would not enter through the gap between the inner peripheral face of the base 94 of the cutting blade 48 and the outer peripheral face of the boss section 88.

Each of suction ports 120 opening to the support surface 90c side of the flange section 90 is connected to a midstream portion of each of the first air passages 114 through second air passages 118. In the connection region A between the first air passage 114 and the second air passage 118, an inner diameter of the first air passage 114 is smaller than in other regions. Therefore, the flow speed of air flowing through the first air passage 114 is enhanced in the connection region A, and the connection region A is reduced in pressure by the Venturi effect.

This causes the air in the second air passage 118 to flow into the first air passage 114, and a negative pressure from the suction port 120 is applied to the back surface side of the cutting blade 48. The cutting blade 48 is sucked and fixed to the blade mount 86 by this negative pressure. Note that an inner diameter of the second air passage 118 in the connection region A is desirably smaller than the inner diameter of the first air passages 114. This makes it difficult for the air flowing through the first air passage 114 to flow into the second air passage 118.

In addition, the structure, the method, and the like according to the present embodiment and the present modification can be carried out with appropriate modifications without departing from the scope of the objects of the present invention.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A cutting blade mounting mechanism for mounting a cutting blade to a tip portion of a spindle of a cutting apparatus, the cutting apparatus including a chuck table holding a workpiece, and a cutting unit cutting the workpiece held by the chuck table by the cutting blade mounted to the tip portion of the spindle rotatably supported by a spindle housing, the cutting blade having a cutting edge at an outer periphery of an annular base, the cutting blade mounting mechanism comprising:
    a blade mount mounted to the tip portion of the spindle; and
    an air supply unit supplying air to the blade mount,
    wherein the blade mount includes:
        a columnar boss section inserted into a through-hole provided in the annular base of the cutting blade;
        a flange section projecting in a radial direction from a side of a base end of the boss section and having a support surface supporting the cutting blade; and
        an ejector type blade suction section having a first air passage connecting a supply port supplied with air from the air supply unit and a discharge port discharging the air, and a second air passage connecting a suction port opening to a side of the support surface of the flange section and the first air passage, and the ejector type blade suction section sucking the cutting blade by a negative pressure applied from the suction port,
    a plurality of the discharge ports are formed in an outer peripheral face of the boss section, and
    an interval between an inner peripheral face of the annular base of the cutting blade into which the boss section is inserted, and the outer peripheral face of the boss section is controlled by the air discharged from the discharge ports.

2. The cutting blade mounting mechanism according to claim 1, wherein an inner diameter of the second air passage in a connection region where the first air passage and the second air passage are connected is smaller than an inner diameter of the first air passage.

3. The cutting blade mounting mechanism according to claim 1, wherein the air supply unit is a rotary joint fixed to the spindle housing and supplying air to the blade mount rotated together with the spindle.

4. The cutting blade mounting mechanism according to claim 2, wherein the air supply unit is a rotary joint fixed to the spindle housing and supplying air to the blade mount rotated together with the spindle.

5. The cutting blade mounting mechanism according to claim 1,
    wherein an air bearing section rotatably supporting the spindle by air and discharging the air through a gap between the spindle housing and the spindle toward a side of the tip portion of the spindle is provided inside the spindle housing, and
    the supply port of the blade mount is supplied with the air discharged through the gap.

6. The cutting blade mounting mechanism according to claim 2,
    wherein an air bearing section rotatably supporting the spindle by air and discharging the air through a gap between the spindle housing and the spindle toward a side of the tip portion of the spindle is provided inside the spindle housing, and
    the supply port of the blade mount is supplied with the air discharged through the gap.

* * * * *